United States Patent
Hori et al.

(10) Patent No.: US 10,121,865 B2
(45) Date of Patent: Nov. 6, 2018

(54) SILICON CARBIDE EPITAXIAL SUBSTRATE AND METHOD OF MANUFACTURING SILICON CARBIDE SEMICONDUCTOR DEVICE

(71) Applicant: Sumitomo Electric Industries, Ltd., Osaka-shi (JP)

(72) Inventors: Tsutomu Hori, Itami (JP); Hironori Itoh, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 15/319,130

(22) PCT Filed: Jul. 4, 2016

(86) PCT No.: PCT/JP2016/069799
§ 371 (c)(1),
(2) Date: Dec. 15, 2016

(87) PCT Pub. No.: WO2017/043164
PCT Pub. Date: Mar. 16, 2017

(65) Prior Publication Data
US 2017/0288025 A1    Oct. 5, 2017

(30) Foreign Application Priority Data

Sep. 11, 2015   (JP) .................. 2015-179566

(51) Int. Cl.
*H01L 29/15* (2006.01)
*H01L 29/36* (2006.01)
(Continued)

(52) U.S. Cl.
CPC .......... *H01L 29/36* (2013.01); *C23C 16/4584* (2013.01); *C23C 16/52* (2013.01);
(Continued)

(58) Field of Classification Search
CPC ... H01L 29/36; H01L 29/1608; H01L 21/046; H01L 21/049; H01L 21/78;
(Continued)

(56) References Cited

U.S. PATENT DOCUMENTS 8,900,974 B2 * 12/2014 Wang .................. H01L 21/6835
438/400
2007/0065577 A1    3/2007 Sumakeris et al.
(Continued)

FOREIGN PATENT DOCUMENTS

JP    2013-098340 A    5/2013
JP    2014-093526 A    5/2014
(Continued)

OTHER PUBLICATIONS

International Search Report in counterpart International Application No. PCT/JP2016/069799 dated Aug. 30, 2016.

*Primary Examiner* — Thinh T Nguyen
(74) *Attorney, Agent, or Firm* — Venable LLP; Michael A. Sartori; Laura G. Remus

(57) ABSTRACT

The silicon carbide layer has a second main surface. The second main surface has a peripheral region within 5 mm from an outer edge thereof, and a central region surrounded by the peripheral region. The silicon carbide layer has a central surface layer. An average value of a carrier concentration in the central surface layer is not less than $1 \times 10^{14}$ $cm^{-3}$ and not more than $5 \times 10^{16}$ $cm^{-3}$. Circumferential uniformity of the carrier concentration is not more than 2%, and in-plane uniformity of the carrier concentration is not more than 10%. An average value of a thickness of a portion of the silicon carbide layer sandwiched between the central region and the silicon carbide single-crystal substrate is not less
(Continued)

than 5 μm. Circumferential uniformity of the thickness is not more than 1%, and in-plane uniformity of the thickness is not more than 4%.

17 Claims, 7 Drawing Sheets

(51) Int. Cl.
| | |
|---|---|
| H01L 29/66 | (2006.01) |
| H01L 29/16 | (2006.01) |
| C30B 25/20 | (2006.01) |
| C30B 29/36 | (2006.01) |
| H01L 21/04 | (2006.01) |
| H01L 21/78 | (2006.01) |
| C23C 16/458 | (2006.01) |
| C23C 16/52 | (2006.01) |
| H01L 21/02 | (2006.01) |
| H01L 29/20 | (2006.01) |
| H01L 29/45 | (2006.01) |

(52) U.S. Cl.
CPC .............. *C30B 25/20* (2013.01); *C30B 29/36* (2013.01); *H01L 21/0262* (2013.01); *H01L 21/02378* (2013.01); *H01L 21/02433* (2013.01); *H01L 21/02447* (2013.01); *H01L 21/02529* (2013.01); *H01L 21/02576* (2013.01); *H01L 21/02609* (2013.01); *H01L 21/046* (2013.01); *H01L 21/049* (2013.01); *H01L 21/0485* (2013.01); *H01L 21/78* (2013.01); *H01L 29/1608* (2013.01); *H01L 29/66068* (2013.01); *H01L 21/02458* (2013.01); *H01L 29/2003* (2013.01); *H01L 29/45* (2013.01)

(58) Field of Classification Search
CPC ........... H01L 29/66068; H01L 21/0485; C30B 29/36; C30B 25/20
USPC .............. 257/77, 76, 78, 341, E33.035, 347; 438/105, 931, 149, 479
See application file for complete search history.

(56) References Cited

U.S. PATENT DOCUMENTS

| | | | |
|---|---|---|---|
| 2012/0161155 A1* | 6/2012 | Harada | ............... C30B 23/00 257/77 |
| 2012/0280254 A1 | 11/2012 | Muto et al. | |
| 2014/0117381 A1 | 5/2014 | Kang et al. | |
| 2014/0252376 A1 | 9/2014 | Itoh | |
| 2015/0072100 A1 | 3/2015 | Genba et al. | |
| 2015/0233018 A1 | 8/2015 | Genba et al. | |

FOREIGN PATENT DOCUMENTS

| | | |
|---|---|---|
| JP | 2014-170891 A | 9/2014 |
| WO | 2011/074453 A1 | 6/2011 |
| WO | 2015/033699 A1 | 3/2015 |
| WO | 2015/114961 A1 | 8/2015 |

* cited by examiner

SILICON CARBIDE EPITAXIAL SUBSTRATE AND METHOD OF MANUFACTURING SILICON CARBIDE SEMICONDUCTOR DEVICE

TECHNICAL FIELD

The present disclosure relates to a silicon carbide epitaxial substrate and a method of manufacturing a silicon carbide semiconductor device. The present application claims priority to Japanese Patent Application No. 2015-179566 filed on Sep. 11, 2015, with the Japan Patent Office, the entire contents of which are hereby incorporated by reference.

BACKGROUND ART

Japanese Patent Laying-Open No. 2014-170891 (PTD 1) discloses a method of forming a silicon carbide layer on a silicon carbide single-crystal substrate by epitaxial growth.

CITATION LIST

Patent Document

PTD 1: Japanese Patent Laying-Open No. 2014-170891

SUMMARY OF INVENTION

A silicon carbide epitaxial substrate according to the present disclosure includes a silicon carbide single-crystal substrate and a silicon carbide layer. The silicon carbide single-crystal substrate has a first main surface. The silicon carbide layer is on the first main surface. The silicon carbide layer has a second main surface opposite to a surface thereof in contact with the silicon carbide single-crystal substrate. The second main surface has a maximum diameter of not less than 100 mm. The second main surface has a peripheral region within 5 mm from an outer edge of the second main surface, and a central region surrounded by the peripheral region. The silicon carbide layer has a central surface layer including the central region. An average value of a carrier concentration in the central surface layer is not less than $1\times10^{14}$ cm$^{-3}$ and not more than $5\times10^{16}$ cm$^{-3}$. Circumferential uniformity of the carrier concentration is not more than 2%, and in-plane uniformity of the carrier concentration is not more than 10%. An average value of a thickness of a portion of the silicon carbide layer sandwiched between the central region and the silicon carbide single-crystal substrate is not less than 5 μm. Circumferential uniformity of the thickness is not more than 1%, and in-plane uniformity of the thickness is not more than 4%. The circumferential uniformity of the carrier concentration is a ratio of an absolute value of a difference between a maximum value and a minimum value of the carrier concentration in the central surface layer in a circumferential direction, to an average value of the carrier concentration in the central surface layer in the circumferential direction. The in-plane uniformity of the carrier concentration is a ratio of an absolute value of a difference between a maximum value and a minimum value of the carrier concentration in the central surface layer in the entire central region, to an average value of the carrier concentration in the central surface layer in the entire central region. The circumferential uniformity of the thickness is a ratio of an absolute value of a difference between a maximum value and a minimum value of the thickness of the portion in the circumferential direction, to an average value of the thickness of the portion in the circumferential direction. The in-plane uniformity of the thickness is a ratio of an absolute value of a difference between a maximum value and a minimum value of the thickness of the portion in the entire central region, to an average value of the thickness of the portion in the entire central region.

DESCRIPTION OF EMBODIMENTS

Figure 1:
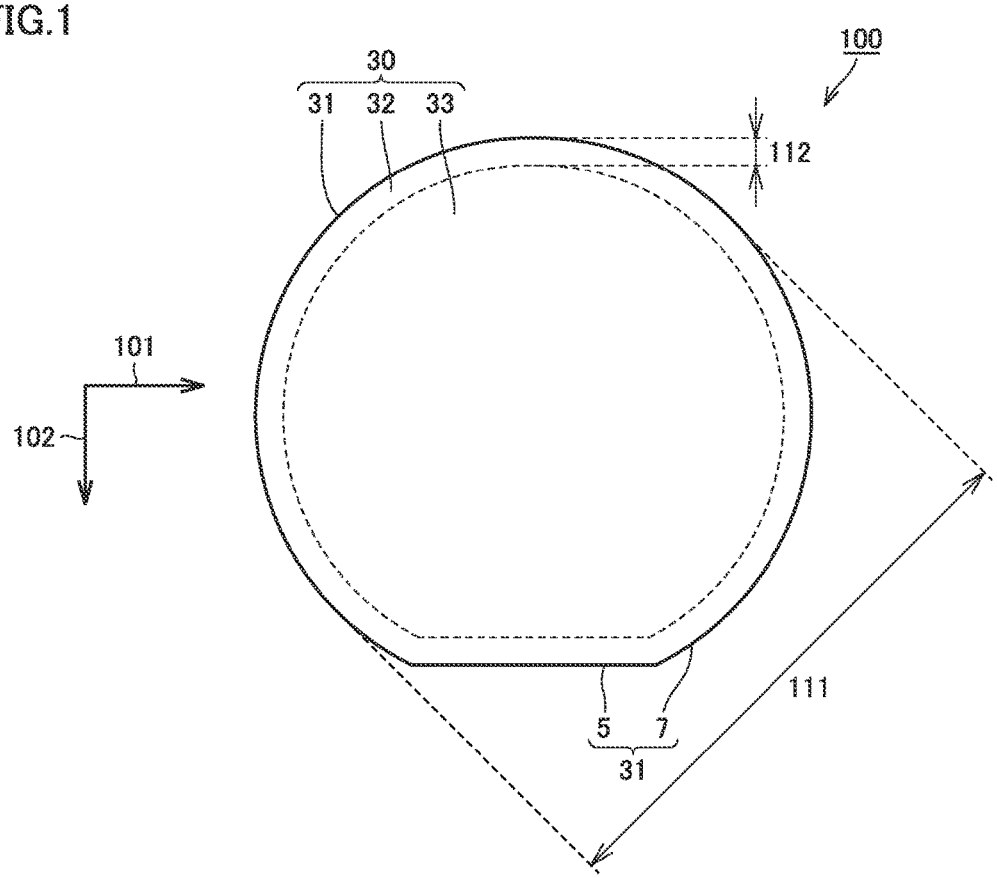
FIG. 1 is a schematic plan view showing the configuration of a silicon carbide epitaxial substrate according to an embodiment.

[Description of Embodiment of the Present Disclosure]

An embodiment of the present disclosure is initially described. In the following description, the same or corresponding elements are designated by the same signs and are not described repeatedly. Regarding crystallographic indications in the present specification, an individual orientation is represented by [ ], a group orientation is represented by < >, an individual plane is represented by ( ), and a group plane is represented by { }. A negative crystallographic index is normally expressed by putting "–" (bar) above a numeral, but is expressed by putting a negative sign before the numeral in the present specification.

(1) A silicon carbide epitaxial substrate 100 according to the present disclosure includes a silicon carbide single-crystal substrate 10 and a silicon carbide layer 20. Silicon carbide single-crystal substrate 10 has a first main surface 11. Silicon carbide layer 20 is on first main surface 11. Silicon carbide layer 20 has a second main surface 30 opposite to a surface 14 thereof in contact with silicon carbide single-crystal substrate 10. Second main surface 30 has a maximum diameter 111 of not less than 100 mm.

Second main surface 30 has a peripheral region 32 within 5 mm from an outer edge 31 of second main surface 30, and a central region 33 surrounded by peripheral region 32. Silicon carbide layer 20 has a central surface layer 25 including central region 33. An average value of a carrier concentration in central surface layer 25 is not less than $1\times10^{14}$ cm$^{-3}$ and not more than $5\times10^{16}$ cm$^{-3}$. Circumferential uniformity of the carrier concentration is not more than 2%, and in-plane uniformity of the carrier concentration is not more than 10%. An average value of a thickness of a portion 27 of the silicon carbide layer sandwiched between central region 33 and silicon carbide single-crystal substrate 10 is not less than 5 μm. Circumferential uniformity of the thickness is not more than 1%, and in-plane uniformity of the thickness is not more than 4%. The circumferential uniformity of the carrier concentration is a ratio of an absolute value of a difference between a maximum value and a minimum value of the carrier concentration in central surface layer 25 in a circumferential direction, to an average value of the carrier concentration in central surface layer 25 in the circumferential direction. The in-plane uniformity of the carrier concentration is a ratio of an absolute value of a difference between a maximum value and a minimum value of the carrier concentration in central surface layer 25 in the entire central region, to an average value of the carrier concentration in central surface layer 25 in the entire central region. The circumferential uniformity of the thickness is a ratio of an absolute value of a difference between a maximum value and a minimum value of the thickness of portion 27 in the circumferential direction, to an average value of the thickness of portion 27 in the circumferential direction. The in-plane uniformity of the thickness is a ratio of an absolute value of a difference between a maximum value and a minimum value of the thickness of portion 27 in the entire central region, to an average value of the thickness of portion 27 in the entire central region.

When forming a silicon carbide layer by epitaxial growth, the silicon carbide layer is formed on a silicon carbide single-crystal substrate while the silicon carbide single-crystal substrate is rotated. The silicon carbide layer is formed at a high temperature of about 1600° C., for example. It is thus impossible to employ a mechanism that mechanically rotates silicon carbide single-crystal substrate 10 by using a metal such as stainless steel. For epitaxial growth of a silicon carbide layer, therefore, a gas foil system is employed in which gas such as hydrogen is used to rotate a susceptor plate holding a silicon carbide single-crystal substrate while floating the susceptor plate.

With the gas foil system, however, a deposition such as silicon carbide may adhere to a portion near a gas jetting port for jetting the gas to the susceptor plate, for example. This causes a change in direction, speed and the like of a gas flow, which then causes a variation in rotational speed of the susceptor plate. If the susceptor plate has a distorted shape, the rotational speed is not stabilized. Further, as the silicon carbide layer is deposited on the silicon carbide single-crystal substrate and the susceptor plate as time proceeds, the total weight changes, which may cause a rotational speed variation. It is believed that the rotational speed is not stabilized with the gas foil system for the reasons described above. It is presumed that this is the cause of a wide variation in thickness of the silicon carbide layer and in carrier concentration in the silicon carbide layer in a circumferential direction of the silicon carbide single-crystal substrate.

Accordingly, the present inventors found that the rotational speed variation can be suppressed by monitoring the rotational speed of the silicon carbide single-crystal substrate, and performing feedback control on a gas flow rate based on this rotational speed. Consequently, uniformity of the carrier concentration in the silicon carbide layer and uniformity of the thickness of the silicon carbide layer can be improved in the circumferential direction of the silicon carbide single-crystal substrate. As a result, in-plane uniformity of the carrier concentration in the silicon carbide layer and in-plane uniformity of the thickness of the silicon carbide layer can be improved.

(2) In silicon carbide epitaxial substrate 100 according to (1) above, the maximum diameter may be not less than 150 mm.

(3) In silicon carbide epitaxial substrate 100 according to (1) or (2) above, the average value of the carrier concentration may be not less than $1\times10^{15}$ cm$^{-3}$ and not more than $1\times10^{16}$ cm$^{-3}$.

(4) In silicon carbide epitaxial substrate 100 according to any one of (1) to (3) above, the circumferential uniformity of the carrier concentration may be not more than 1%.

(5) In silicon carbide epitaxial substrate 100 according to any one of (1) to (4) above, the in-plane uniformity of the carrier concentration may be not more than 5%.

(6) A silicon carbide epitaxial substrate 100 according to the present disclosure includes a silicon carbide single-crystal substrate 10 and a silicon carbide layer 20. Silicon carbide single-crystal substrate 10 has a first main surface 11. Silicon carbide layer 20 is on first main surface 11. Silicon carbide layer 20 has a second main surface 30 opposite to a surface 14 thereof in contact with silicon carbide single-crystal substrate 10. Second main surface 30 has a maximum diameter 111 of not less than 150 mm. Second main surface 30 has a peripheral region 32 within 5 mm from an outer edge 31 of second main surface 30, and a central region 33 surrounded by peripheral region 32. Silicon carbide layer 20 has a central surface layer 25 including central region 33. An average value of a carrier concentration in central surface layer 25 is not less than $1\times10^{15}$ cm$^{-3}$ and not more than $1\times10^{16}$ cm$^{-3}$. Circumferential uniformity of the carrier concentration is not more than 1%, and in-plane uniformity of the carrier concentration is not more than 5%. An average value of a thickness of a portion 27 of the silicon carbide layer sandwiched between central region 33 and silicon carbide single-crystal substrate 10 is not less than 5 μm. Circumferential uniformity of the thickness is not more than 1%, and in-plane uniformity of the thickness is not more than 4%. The circumferential uniformity of the carrier concentration is a ratio of an absolute value of a difference between a maximum value and a minimum value of the carrier concentration in central surface layer 25 in a circumferential direction, to an average value of the carrier concentration in central surface layer 25 in the circumferential direction. The in-plane uniformity of the carrier concentration is a ratio of an absolute value of a difference between a maximum value and a minimum value of the carrier concentration in central surface layer 25 in the entire central region, to an average value of the carrier concentration in central surface layer 25 in the entire central region. The circumferential uniformity of the thickness is a ratio of an absolute value of a difference between a maximum value and a minimum value of the thickness of portion 27 in the circumferential direction, to an average value of the thickness of portion 27 in the circumferential direction. The in-plane uniformity of the thickness is a ratio of an absolute value of a difference between a maximum value and a minimum value of the thickness of portion 27 in the entire central region, to an average value of the thickness of portion 27 in the entire central region.

(7) A method of manufacturing a silicon carbide semiconductor device according to the present disclosure includes the following steps. Silicon carbide epitaxial substrate 100 according to any one of (1) to (6) above is prepared. Silicon carbide epitaxial substrate 100 is processed.

[Details of Embodiment of the Present Disclosure]

One embodiment of the present disclosure (hereinafter also referred to as "the present embodiment") is described below. However, the present embodiment is not limited as such.

(Silicon Carbide Epitaxial Substrate)

Figure 2:
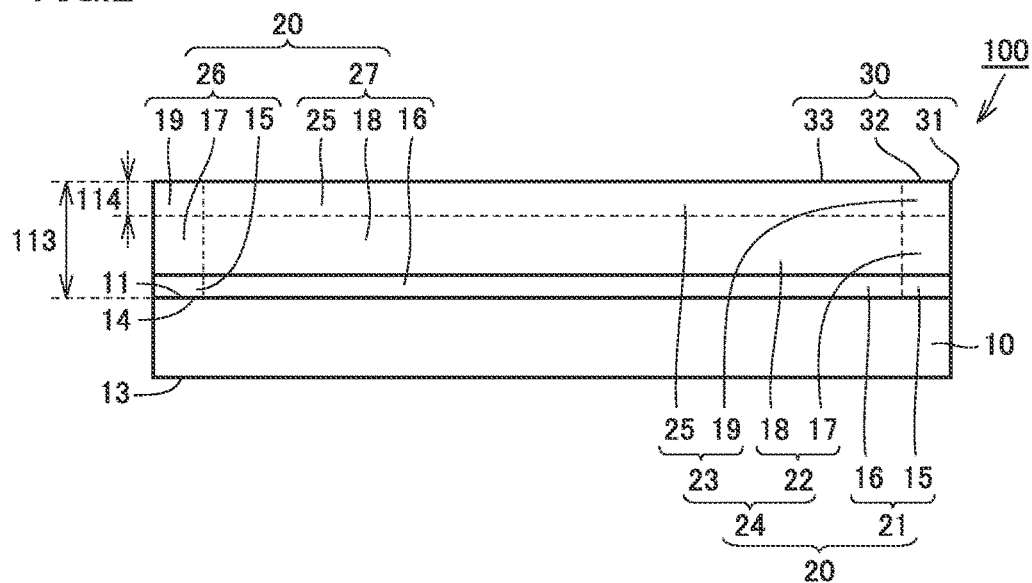
FIG. 2 is a schematic cross-sectional view showing the configuration of the silicon carbide epitaxial substrate according to the embodiment.

As shown in FIGS. 1 and 2, a silicon carbide epitaxial substrate 100 according to the present embodiment has a silicon carbide single-crystal substrate 10 and a silicon carbide layer 20. Silicon carbide single-crystal substrate 10 has a first main surface 11, and a third main surface 13 opposite to first main surface 11. Silicon carbide layer 20 has a fourth main surface 14 in contact with silicon carbide single-crystal substrate 10, and a second main surface 30 opposite to fourth main surface 14. As shown in FIG. 1, silicon carbide epitaxial substrate 100 may have a first flat 5 extending in a first direction 101. Silicon carbide epitaxial substrate 100 may have a second flat (not shown) extending in a second direction 102. First direction 101 is a <11-20> direction, for example. Second direction 102 is a <1-100> direction, for example.

Silicon carbide single-crystal substrate 10 (hereinafter sometimes abbreviated as "single-crystal substrate") is made of a silicon carbide single crystal. This silicon carbide single crystal has a polytype of 4H—SiC, for example. The 4H—SiC has better electron mobility, dielectric strength, and the like than other polytypes. Silicon carbide single-crystal substrate 10 contains an n type impurity such as nitrogen. Silicon carbide single-crystal substrate 10 has n type conductivity, for example. First main surface 11 is a {0001} plane or a plane tilted not more than 8° from the {0001} plane, for example. If first main surface 11 is tilted from the {0001} plane, a tilt direction of the normal of first main surface 11 is the <11-20> direction, for example.

Silicon carbide layer 20 is an epitaxial layer formed on silicon carbide single-crystal substrate 10. Silicon carbide layer 20 is on first main surface 11. Silicon carbide layer 20 is in contact with first main surface 11. Silicon carbide layer 20 contains an n type impurity such as nitrogen (N). Silicon carbide layer 20 has n type conductivity, for example. The n type impurity contained in silicon carbide layer 20 may be lower in concentration than the n type impurity contained in silicon carbide single-crystal substrate 10. As shown in FIG. 1, second main surface 30 has a maximum diameter 111 (diameter) of not less than 100 mm. Maximum diameter 111 may be not less than 150 mm, or not less than 200 mm, or not less than 250 mm. The upper limit of maximum diameter 111 is not particularly limited. The upper limit of maximum diameter 111 may be 300 mm, for example.

Second main surface 30 may be the {0001} plane or a plane tilted not more than 8° from the {0001} plane, for example. Specifically, second main surface 30 may be a (0001) plane or a plane tilted not more than 8° from the (0001) plane. A tilt direction (off direction) of the normal of second main surface 30 may be the <11-20> direction, for example. A tilt angle (off angle) from the {0001} plane may be not less than 1°, or not less than 2°. The off angle may be not more than 7°, or not more than 6°.

As shown in FIG. 1, second main surface 30 has a peripheral region 32, and a central region 33 surrounded by peripheral region 32. Peripheral region 32 is a region within 5 mm from an outer edge 31 of second main surface 30. Put another way, in a radial direction of second main surface 30, a distance 112 between outer edge 31 and the boundary between peripheral region 32 and central region 33 is 5 mm.

As shown in FIG. 2, silicon carbide layer 20 has a buffer layer 21 and a drift layer 24. The n type impurity contained in drift layer 24 may be lower in concentration than the n type impurity contained in buffer layer 21. Drift layer 24 includes a superficial region 23 and a deep region 22. Superficial region 23 forms second main surface 30. Superficial region 23 has a central surface layer 25 and a peripheral superficial region 19. Central surface layer 25 forms central region 33. Peripheral superficial region 19 forms peripheral region 32. As seen from a direction perpendicular to second main surface 30, central surface layer 25 is surrounded by peripheral superficial region 19. Central surface layer 25 is a region within about 5 μm from central region 33 toward the first main surface.

Deep region 22 has a central deep region 18 and a peripheral deep region 17. As seen from the direction perpendicular to second main surface 30, central deep region 18 is surrounded by peripheral deep region 17. Similarly, buffer layer 21 has a central buffer region 16 and a peripheral buffer region 15. As seen from the direction perpendicular to second main surface 30, central buffer region 16 is surrounded by peripheral buffer region 15. Central deep region 18 is sandwiched between central buffer region 16 and central surface layer 25. Similarly, peripheral deep region 17 is sandwiched between peripheral buffer region 15 and peripheral superficial region 19.

Silicon carbide layer 20 is formed of a central silicon carbide region 27 and a peripheral silicon carbide region 26. Central silicon carbide region 27 is formed of central surface layer 25, central deep region 18, and central buffer region 16. Similarly, peripheral silicon carbide region 26 is formed of peripheral superficial region 19, peripheral deep region 17, and peripheral buffer region 15.

(Circumferential Uniformity and In-Plane Uniformity of Carrier Concentration)

Silicon carbide layer 20 contains nitrogen, for example, as a dopant. According to silicon carbide epitaxial substrate 100 in accordance with the present disclosure, an average value of a carrier concentration in central surface layer 25 is not less than $1\times10^{14}$ cm$^{-3}$ and not more than $5\times10^{16}$ cm$^{-3}$. In central surface layer 25, circumferential uniformity of the carrier concentration is not more than 2%, and in-plane uniformity of the carrier concentration is not more than 10%. The lower the values of the circumferential uniformity and in-plane uniformity, the more uniform the distribution of the carrier concentration. As used herein, the carrier concentration refers to effective carrier concentration. For example, if a silicon carbide layer includes a donor and an acceptor, the effective carrier concentration is calculated as an absolute value of a difference between donor concentration ($N_d$) and acceptor concentration ($N_a$), that is, as ($|N_d-N_a|$). A method of measuring the carrier concentration will be described later.

In central surface layer 25, the average value of the carrier concentration may be not more than $2\times10^{16}$ cm$^{-3}$, or not more than $9\times10^{15}$ cm$^{-3}$. The average value of the carrier concentration may be not less than $1\times10^{15}$ cm$^{-3}$, or not less than $5\times10^{15}$ cm$^{-3}$, for example.

In central surface layer 25, the circumferential uniformity of the carrier concentration may be not more than 1.5%, or not more than 1%, or not more than 0.5%. In central surface layer 25, the in-plane uniformity of the carrier concentration may be not more than 8%, or not more than 5%, or not more than 3%.

Next, the method of measuring the carrier concentration is described. The carrier concentration is measured with a C-V measurement apparatus of a mercury probe system, for example. Specifically, one probe is disposed at a measurement position in central region 33 which will be described later, and the other probe is disposed at third main surface 13. One probe has an area of 0.01 cm$^2$, for example. A voltage is applied between the one and the other probes, and a capacitance between the one and the other probes is measured.

Figure 3:
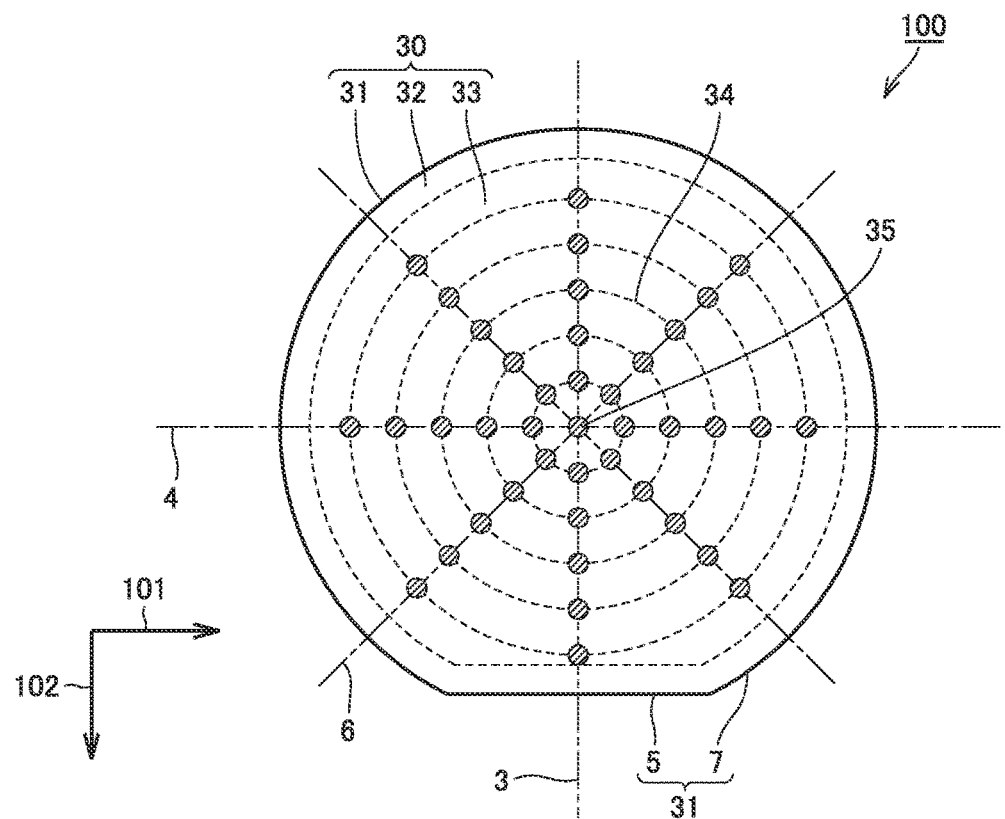
FIG. 3 is a schematic plan view showing measurement positions of carrier concentration.

As shown in FIG. 3, a plurality of concentric circles 34 centered on a center 35 of second main surface 30 are considered. Each of the plurality of concentric circles 34 has common center 35. As shown in FIG. 3, the measurement positions of the carrier concentration may be hatched positions. Specifically, the measurement positions of the carrier concentration are on a line 4 passing through center 35 and parallel to first direction 101, on a line 3 passing through center 35 and parallel to second direction 102, and on a line 6 passing through center 35 and bisecting an angle formed by line 4 and line 3. A line segment connecting an intersection point of the boundary between peripheral region 32 and central region 33 and line 3 to center 35 is divided into substantially equal five sections. The measurement positions may be positions of intersection points of five concentric circles 34 passing through each position of the line segment that is divided into five sections and centered on center 35, and line 3, line 4 and line 6. As shown in FIG. 3, the carrier concentration is measured at a total of 31 measurement positions in the central region.

As shown in FIG. 3, outer edge 31 includes an arc potion 7 and linear first flat 5. The center of a circumscribed circle of a triangle formed by any three points on arc potion 7 may be center 35 of second main surface 30.

The circumferential uniformity of the carrier concentration is a ratio of an absolute value of a difference between a maximum value and a minimum value of the carrier concentration in central surface layer 25 in a circumferential direction, to an average value of the carrier concentration in central surface layer 25 in the circumferential direction. Specifically, an average value, a maximum value, and a minimum value of the carrier concentration at eight measurement positions on a single concentric circle 34 are determined, to calculate the circumferential uniformity of the carrier concentration. According to the silicon carbide epitaxial substrate in accordance with the present disclosure, the circumferential uniformity of the carrier concentration is not more than 2% in each of five concentric circles 34 described above. For example, when the average value of the carrier concentration at the eight measurement positions is $1.00 \times 10^{16}$ cm$^{-3}$, the maximum value is $1.01 \times 10^{16}$ cm$^{-3}$, and the minimum value is $0.99 \times 10^{16}$ cm$^{-3}$, the circumferential uniformity of the carrier concentration is $(1.01 \times 10^{16}$ cm$^{-3}-0.99 \times 10^{16}$ cm$^{-3})/1.00 \times 10^{16}$ cm$^{-3}$=2%.

The in-plane uniformity of the carrier concentration is a ratio of an absolute value of a difference between a maximum value and a minimum value of the carrier concentration in central surface layer 25 in the entire central region, to an average value of the carrier concentration in central surface layer 25 in the entire central region. Specifically, an average value, a maximum value, and a minimum value of the carrier concentration at the 31 measurement positions are determined, to calculate the in-plane uniformity of the carrier concentration. According to the silicon carbide epitaxial substrate in accordance with the present disclosure, the in-plane uniformity of the carrier concentration is not more than 10%. For example, when the average value of the carrier concentration at the 31 measurement positions is $1.00 \times 10^{16}$ cm$^{-3}$, the maximum value is $1.05 \times 10^{16}$ cm$^{-3}$, and the minimum value is $0.95 \times 10^{16}$ cm$^{-3}$, the in-plane uniformity of the carrier concentration is $(1.05 \times 10^{16}$ cm$^{-3}-0.95 \times 10^{16}$ cm$^{-3})/1.00 \times 10^{16}$ cm$^{-3}$=10%.

Figure 4:
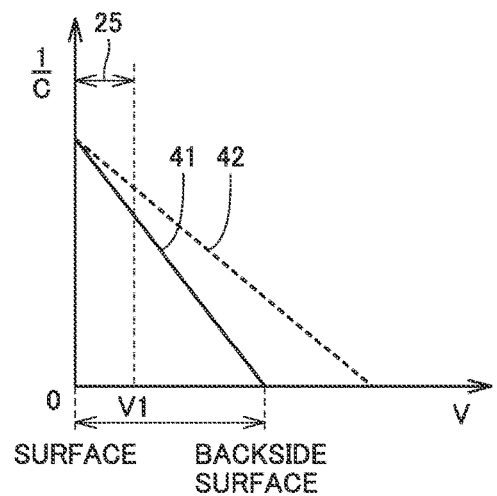
FIG. 4 illustrates a method of determining the carrier concentration by the capacitance-voltage (C-V) method.

As shown in FIG. 4, measurement data 41 is plotted with a vertical axis representing 1/C (inverse of capacitance) and a horizontal axis representing V (voltage). As shown in FIG. 4, as the voltage increases, the inverse of the capacitance decreases. The carrier concentration is determined from the tilt of the line of measurement data 41. The higher the absolute value of the tilt of measurement data 41, the higher the carrier concentration. In FIG. 4, a carrier concentration in the substrate indicating measurement data 41 represented as a line is higher than a carrier concentration in the substrate indicating measurement data 42 represented as a broken line. A measurement depth of the carrier concentration depends on the voltage applied. In the present embodiment, the voltage is swept from 0 V to 5 V (voltage V1 in FIG. 4), for example. Consequently, the carrier concentration in central surface layer 25 which is within about 5 μm from central region 33 toward first main surface 11 is measured. When the voltage exceeds voltage V1, the carrier concentration in a region of a greater depth is measured.

(Circumferential Uniformity and In-Plane Uniformity of Thickness of Silicon Carbide Layer)

An average value of a thickness 113 of a portion of the silicon carbide layer sandwiched between central region 33 and silicon carbide single-crystal substrate 10 (specifically, central silicon carbide region 27) is not less than 5 μm. The average value of thickness 113 may be not less than 10 μm, or not less than 15 μm. Circumferential uniformity of the thickness is not more than 1%, and in-plane uniformity of the thickness is not more than 4%. The circumferential uniformity of the thickness is a ratio of an absolute value of a difference between a maximum value and a minimum value of the thickness of central silicon carbide region 27 in the circumferential direction, to an average value of the thickness of central silicon carbide region 27 in the circumferential direction. The in-plane uniformity of the thickness is a ratio of an absolute value of a difference between a maximum value and a minimum value of the thickness of central silicon carbide region 27 in the entire central region, to an average value of the thickness of central silicon carbide region 27 in the entire central region.

The measurement positions of the thickness may be the same as the measurement positions of the carrier concentration described above. Specifically, as shown in FIG. 3, an average value, a maximum value, and a minimum value of the thickness of central silicon carbide region 27 at eight measurement positions on a single concentric circle 34 are determined, to calculate the circumferential uniformity of the thickness of central silicon carbide region 27. According to the silicon carbide epitaxial substrate in accordance with the present disclosure, the circumferential uniformity of the thickness is not more than 1% in each of five concentric circles 34 described above. For example, when the average value of the thickness of central silicon carbide region 27 at the eight measurement positions is 10.00 μm, the maximum value is 10.05 μm, and the minimum value is 9.95 μm, the circumferential uniformity of the thickness is (10.05 μm−9.95 μm)/10 μm=1%. Similarly, an average value, a maximum value, and a minimum value of the thickness of central silicon carbide region 27 at the 31 measurement positions are determined, to calculate the in-plane uniformity of the thickness of central silicon carbide region 27. When the average value of the thickness of central silicon carbide region 27 at the 31 measurement positions is 10.0 μm, the maximum value is 10.2 μm, and the minimum value is 9.8 μm, the circumferential uniformity of the thickness is (10.2 μm−9.8 μm)/10 μm=4%.

(Film Formation Apparatus)

Next, the configuration of a manufacturing apparatus 200 used in a method of manufacturing silicon carbide epitaxial substrate 100 according to the present embodiment is described.

Figure 5:
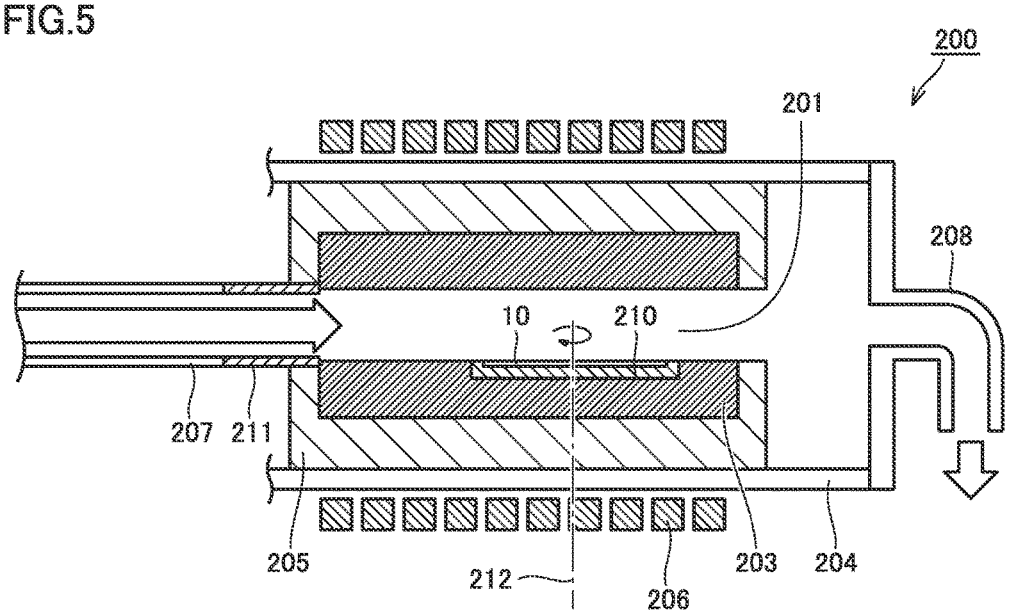
FIG. 5 is a partial schematic cross-sectional view showing the configuration of a susceptor plate of a manufacturing apparatus for the silicon carbide epitaxial substrate according to the embodiment.

As shown in FIG. 5, manufacturing apparatus 200 is a hot wall CVD (Chemical Vapor Deposition) apparatus, for example. Manufacturing apparatus 200 mainly has a heating element 203, a quartz tube 204, a heat insulator 205, an induction heating coil 206, and an auxiliary heating mechanism 211. A hollow portion surrounded by heating element 203 is a reaction chamber 201. A susceptor plate 210 holding silicon carbide single-crystal substrate 10 is provided in reaction chamber 201. Susceptor plate 210 can rotate around its axis. Silicon carbide single-crystal substrate 10 is placed on susceptor plate 210 with first main surface 11 facing upward.

Heating element 203 is made of graphite, for example. Induction heating coil 206 is wound around and along the circumference of quartz tube 204. By supplying a prescribed AC current to induction heating coil 206, heating element 203 is induction heated. Reaction chamber 201 is thus heated.

Manufacturing apparatus 200 further has a gas inlet port 207 and a gas outlet port 208. Gas outlet port 208 is connected to an air exhaust pump (not shown). Arrows in FIG. 5 indicate a gas flow. A carrier gas, a source gas and a doping gas are introduced through gas inlet port 207 into reaction chamber 201, and exhausted through gas outlet port 208. A pressure in reaction chamber 201 is adjusted by a balance between a supplied amount of gas and an exhausted amount of gas.

(Feedback Control Unit)

Figure 6:
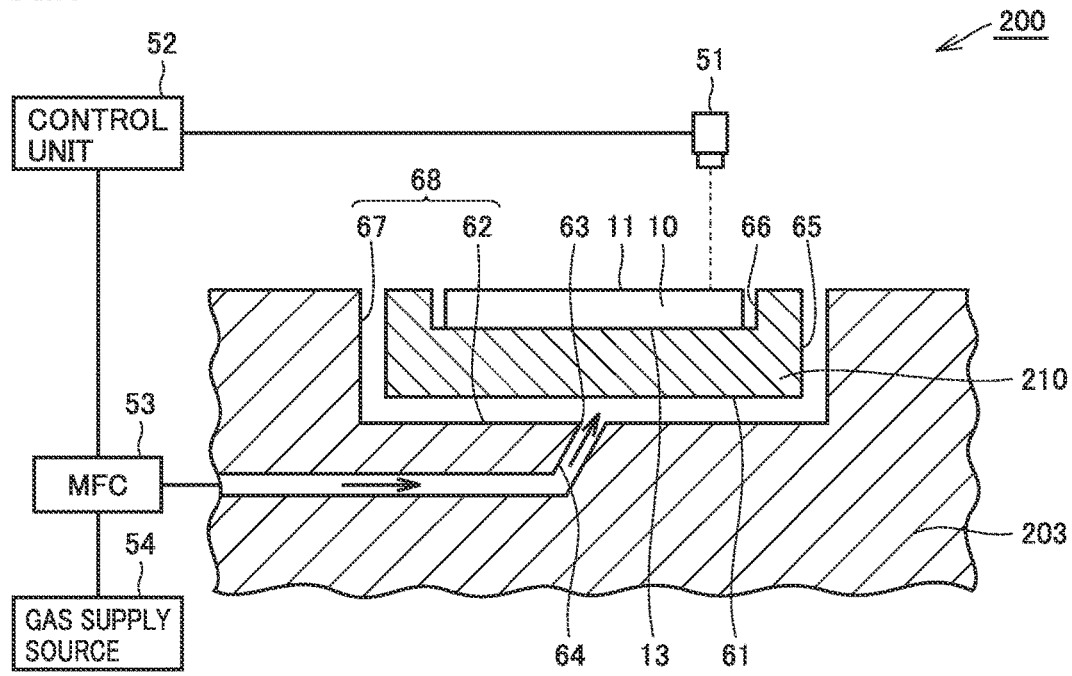
FIG. 6 is a functional block diagram showing the configuration of the manufacturing apparatus for the silicon carbide epitaxial substrate according to the embodiment.

As shown in FIG. 6, manufacturing apparatus 200 may further have a rotational speed meter 51, a control unit 52, a MFC (Mass Flow Controller) 53, and a gas supply source 54. Rotational speed meter 51 may be a laser rotational speed meter configured to be able to monitor a rotational speed of silicon carbide single-crystal substrate 10 (put another way, a rotational speed of susceptor plate 210) by using a laser beam, for example. Rotational speed meter 51 may monitor the rotational speed of silicon carbide single-crystal substrate 10 with reference to first flat 5 of silicon carbide single-crystal substrate 10. Rotational speed meter 51 is disposed at a position facing first main surface 11.

Heating element 203 is provided with a recess 68. Recess 68 is formed of a bottom surface 62 and a side surface 67. Bottom surface 62 is provided with a gas jetting port 63. Gas jetting port 63 is communicated with a flow path 64 provided in heating element 203. Gas supply source 54 is configured to be able to supply gas such as hydrogen to flow path 64. MFC 53 is provided between gas supply source 54 and flow path 64. MFC 53 is configured to be able to control a flow rate of the gas supplied from gas supply source 54 to flow path 64. The gas supply source is a gas cylinder capable of supplying inert gas such as hydrogen or argon.

Figure 7:
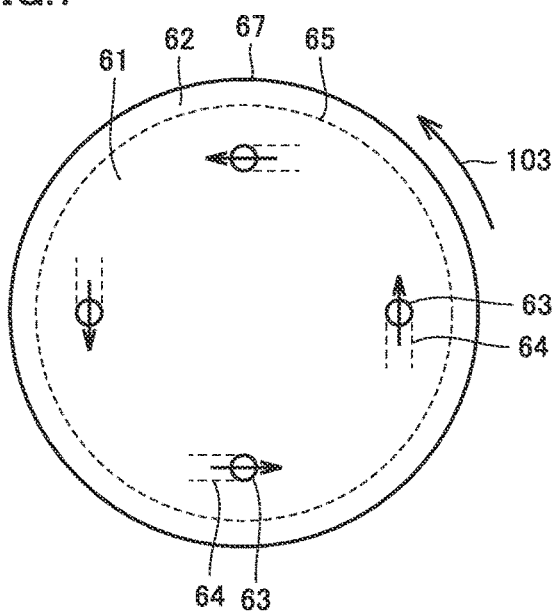
FIG. 7 is a schematic plan view showing the configuration of gas jetting ports of the manufacturing apparatus for the silicon carbide epitaxial substrate according to the embodiment.

As shown in FIG. 7, bottom surface 62 is provided with a plurality of gas jetting ports 63. As seen from a direction perpendicular to bottom surface 62, gas jetting ports 63 may be provided at positions of 0°, 90°, 180° and 270°, for example. Each of the plurality of gas jetting ports 63 is configured to be able to jet the gas along a circumferential direction of a bottom surface 61 of susceptor plate 210. As seen from a direction parallel to bottom surface 62 (in the field of vision of FIG. 6), a direction of the gas jetted from gas jetting port 63 may be tilted relative to bottom surface 61. In FIGS. 6 and 7, directions of arrows indicate a direction of gas flow. By jetting the gas to bottom surface 61, susceptor plate 210 floats and rotates in a circumferential direction 103 of silicon carbide single-crystal substrate 10. Susceptor plate 210 rotates in circumferential direction 103, with bottom surface 61 of susceptor plate 210 being separated from bottom surface 62 of recess 68, and with a side surface 65 of susceptor plate 210 being separated from side surface 67 of recess 68.

Control unit 52 is configured to be able to acquire information about the rotational speed of silicon carbide single-crystal substrate 10 measured by rotational speed meter 51. Control unit 52 is configured to be able to transmit a signal to MFC 53 based on the information about the rotational speed of silicon carbide single-crystal substrate 10. For example, when the rotational speed of susceptor plate 210 is lower than a desired rotational speed, control unit 52 transmits to MFC 53 a signal for increasing the flow rate of the gas supplied to flow path 64. Accordingly, the flow rate of the gas supplied from gas supply source 54 to flow path 64 increases. As a result, the rotational speed of silicon carbide single-crystal substrate 10 increases. Conversely, when the rotational speed of susceptor plate 210 is higher than the desired rotational speed, control unit 52 transmits to MFC 53 a signal for reducing the flow rate of the gas supplied to flow path 64. Accordingly, the flow rate of the gas supplied from gas supply source 54 to flow path 64 decreases. As a result, the rotational speed of silicon carbide single-crystal substrate 10 decreases.

In other words, the flow rate of the gas introduced into flow path 64 is adjusted based on the rotational speed of silicon carbide single-crystal substrate 10 detected by rotational speed meter 51. Put another way, rotational speed meter 51, control unit 52 and MFC 53 form a feedback circuit. Thus, a rotational speed variation of silicon carbide single-crystal substrate 10 can be suppressed. As a result, the uniformity of the carrier concentration can be improved in a circumferential direction of second main surface 30.

Usually, susceptor plate 210 and single-crystal substrate 10 are disposed substantially centrally in an axial direction of reaction chamber 201. As shown in FIG. 5, in the present disclosure, susceptor plate 210 and single-crystal substrate 10 may be disposed on the downstream side relative to the center of reaction chamber 201, that is, toward gas outlet port 208. This is to advance decomposition reaction of the source gas to a sufficient degree before the source gas reaches single-crystal substrate 10. It is expected that a C/Si ratio is thus distributed uniformly in the plane of single-crystal substrate 10.

(Auxiliary Heating Mechanism)

Ammonia gas, which serves as a dopant gas, is desirably heated sufficiently and thermally decomposed before being supplied to reaction chamber 201. It is expected that in-plane uniformity of a nitrogen concentration (carrier concentration) is thus improved in silicon carbide layer 20. As shown in FIG. 5, auxiliary heating mechanism 211 is provided on the upstream side of reaction chamber 201. The ammonia gas can be heated in advance at auxiliary heating mechanism 211. Auxiliary heating mechanism 211 includes a chamber heated to not less than 1300° C., for example. The ammonia gas is thermally decomposed to a sufficient degree when passing through auxiliary heating mechanism 211, and then supplied to reaction chamber 201. With such a configuration, the ammonia gas can be thermally decomposed without causing significant disturbance in the gas flow.

The temperature of an inner wall surface of auxiliary heating mechanism 211 is more preferably not less than 1350° C. This is to facilitate the thermal decomposition of the ammonia gas. In view of thermal efficiency, the temperature of the inner wall surface of auxiliary heating mechanism 211 is preferably not more than 1600° C. Auxiliary heating mechanism 211 may be integrated with, or separated from, reaction chamber 201. The gas passed through auxiliary heating mechanism 211 may be only the ammonia gas, or may include another gas. For example, the entire source gas may be passed through auxiliary heating mechanism 211.

(Method of Manufacturing Silicon Carbide Epitaxial Substrate)

Next, a method of manufacturing the silicon carbide epitaxial substrate according to the present embodiment is described.

First, a silicon carbide single crystal having a polytype of 6H is fabricated by sublimation, for example. Then, the silicon carbide single crystal is sliced by a wire saw, for example, whereby silicon carbide single-crystal substrate 10 is prepared. Silicon carbide single-crystal substrate 10 has first main surface 11, and third main surface 13 opposite to first main surface 11. First main surface 11 is a plane tilted not more than 8° from the {0001} plane, for example. As shown in FIGS. 5 and 6, silicon carbide single-crystal substrate 10 is disposed within a recess 66 in susceptor plate 210 such that first main surface 11 is exposed at susceptor plate 210. Then, using manufacturing apparatus 200 described above, silicon carbide layer 20 is formed on silicon carbide single-crystal substrate 10 by epitaxial growth.

For example, after the pressure in reaction chamber 201 is lowered from atmospheric pressure to about 1×10$^{-6}$ Pa, a temperature rise of silicon carbide single-crystal substrate 10 is started. In the course of the temperature rise, hydrogen (H$_2$) gas serving as the carrier gas is introduced into reaction chamber 201.

After the temperature in reaction chamber 201 reaches about 1600° C., for example, the source gas and the doping gas are introduced into reaction chamber 201. The source gas includes a Si source gas and a C source gas. Silane (SiH$_4$) gas can be used, for example, as the Si source gas. Propane (C$_3$H$_8$) gas can be used, for example, as the C source gas. The silane gas and the propane gas have a flow rate of 46 sccm and 14 sccm, respectively, for example. A volume ratio of the silane gas to the hydrogen is 0.04%, for example. The source gas has a C/Si ratio of 0.9, for example.

Ammonia (NH$_3$) gas is used, for example, as the doping gas. Ammonia gas is thermally decomposed more readily than nitrogen gas having a triple bond. It is expected that the use of ammonia gas will improve the in-plane uniformity of the carrier concentration. The ammonia gas has a concentration of 1 ppm, for example, relative to the hydrogen gas. It is desired to thermally decompose the ammonia gas at auxiliary heating mechanism 211 before introducing the gas into reaction chamber 201. The ammonia gas is heated to not less than 1300° C., for example, by auxiliary heating mechanism 211.

By introducing the carrier gas, the source gas and the doping gas into reaction chamber 201 while heating silicon carbide single-crystal substrate 10 at about 1600° C., silicon carbide layer 20 is formed on silicon carbide single-crystal substrate 10 by epitaxial growth. During the epitaxial growth of silicon carbide layer 20, susceptor plate 210 rotates about a rotation axis 212 (see FIG. 5). An average rotational speed of susceptor plate 210 is 20 rpm, for example.

As shown in FIG. 6, during the formation of silicon carbide layer 20 on silicon carbide single-crystal substrate 10 by epitaxial growth, the rotational speed of silicon carbide single-crystal substrate 10 is monitored by rotational speed meter 51. Control unit 52 acquires information about the rotational speed of silicon carbide single-crystal substrate 10 measured by rotational speed meter 51. Control unit 52 transmits a signal to MFC 53 based on the information about the rotational speed of silicon carbide single-crystal substrate 10. In other words, the flow rate of the gas introduced into flow path 64 is adjusted based on the rotational speed of silicon carbide single-crystal substrate 10 detected by rotational speed meter 51.

For example, it is assumed that a target rotational speed of susceptor plate 210 is 20 rpm. When the rotational speed of susceptor plate 210 falls below 20 rpm by a certain amount, for example, control unit 52 transmits to MFC 53 a signal for increasing the flow rate of the gas supplied to flow path 64. Accordingly, the flow rate of the gas supplied from gas supply source 54 to flow path 64 increases. As a result, the rotational speed increases and approaches 20 rpm. Conversely, when the rotational speed exceeds 20 rpm by a certain amount, control unit 52 transmits to MFC 53 a signal for reducing the flow rate of the gas supplied to flow path 64. Accordingly, the flow rate of the gas supplied from gas supply source 54 to flow path 64 decreases. As a result, the rotational speed decreases and approaches 20 rpm.

Figure 8:
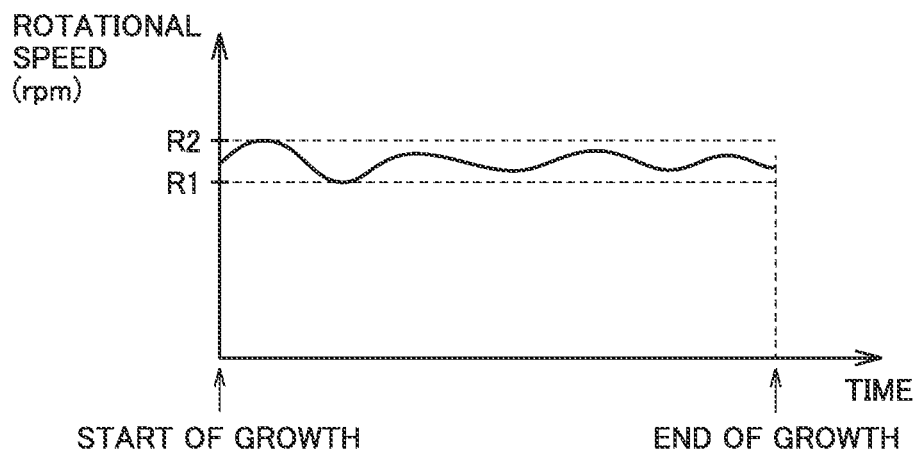
FIG. 8 illustrates relation between a rotational speed of the susceptor plate and time.

As shown in FIG. 8, the rotational speed of susceptor plate 210 slightly varies between a starting point of growth and an ending point of growth of silicon carbide layer 20. The rotational speed may alternately rise and fall repeatedly during the step of forming silicon carbide layer 20. The amplitude of the rotational speed may decrease as time proceeds. The rotational speed may converge to a certain value as time proceeds. Preferably, the rotational speed of susceptor plate 210 is controlled at ±10% of the average rotational speed. For example, when the average rotational speed is 20 rpm, the rotational speed is desirably controlled at not less than 18 rpm and not more than 22 rpm during the step of forming silicon carbide layer 20. In other words, a maximum rotational speed R2 is desirably not more than 22 rpm and a minimum rotational speed R1 is desirably not less than 18 rpm. The rotational speed of susceptor plate 210 is more preferably controlled at ±8% of the average rotational speed, and further preferably controlled at ±5% of the average rotational speed. In this manner, silicon carbide layer 20 is formed on silicon carbide single-crystal substrate 10 by epitaxial growth. Accordingly, the uniformity of the carrier concentration in silicon carbide layer 20 and the uniformity of the thickness of silicon carbide layer 20 can be improved in the circumferential direction of silicon carbide single-crystal substrate 10. As a result, the in-plane uniformity of the carrier concentration in silicon carbide layer 20 and the in-plane uniformity of the thickness of silicon carbide layer 20 can be improved.

(Method of Manufacturing Silicon Carbide Semiconductor Device)

Next, a method of manufacturing a silicon carbide semiconductor device 300 according to the present embodiment is described.

Figure 9:
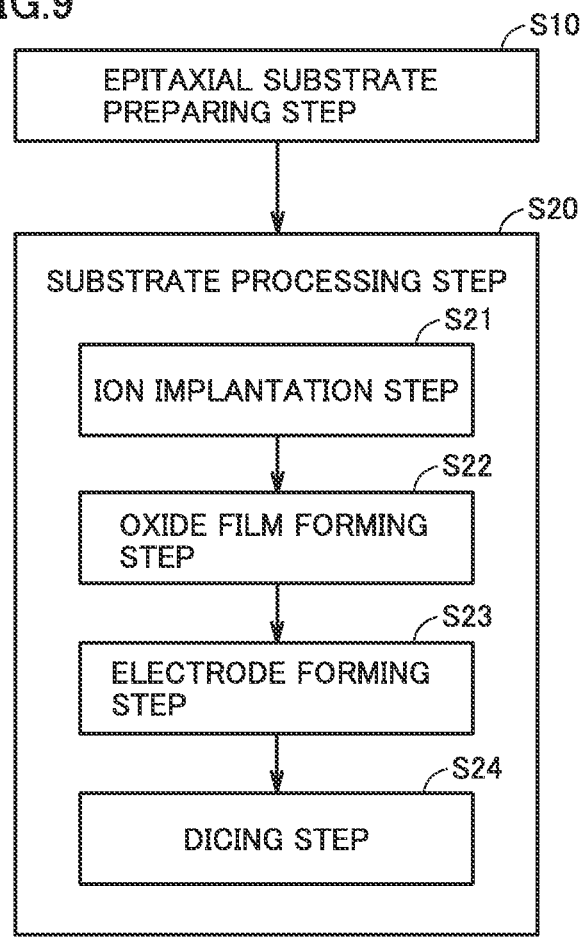
FIG. 9 is a flowchart illustrating an overview of a method of manufacturing a silicon carbide semiconductor device according to the embodiment.

The method of manufacturing the silicon carbide semiconductor device according to the present embodiment mainly has an epitaxial substrate preparing step (S10: FIG. 9) and a substrate processing step (S20: FIG. 9).

First, the epitaxial substrate preparing step (S10: FIG. 9) is performed. Specifically, silicon carbide epitaxial substrate 100 is prepared by the method of manufacturing the silicon carbide epitaxial substrate described above (see FIG. 1).

Next, the substrate processing step (S20: FIG. 9) is performed. Specifically, the silicon carbide epitaxial substrate is processed to manufacture a silicon carbide semiconductor device. The "processing" includes various types of processing such as ion implantation, heat treatment, etching, oxide film formation, electrode formation, and dicing. That is, the substrate processing step may include at least any one of the types of processing including ion implantation, heat treatment, etching, oxide film formation, electrode formation, and dicing.

Described below is a method of manufacturing a MOSFET (Metal Oxide Semiconductor Field Effect Transistor) as an example silicon carbide semiconductor device. The substrate processing step (S20: FIG. 9) includes an ion implantation step (S21: FIG. 9), an oxide film forming step (S22: FIG. 9), an electrode forming step (S23: FIG. 9), and a dicing step (S24: FIG. 9).

Figure 10:
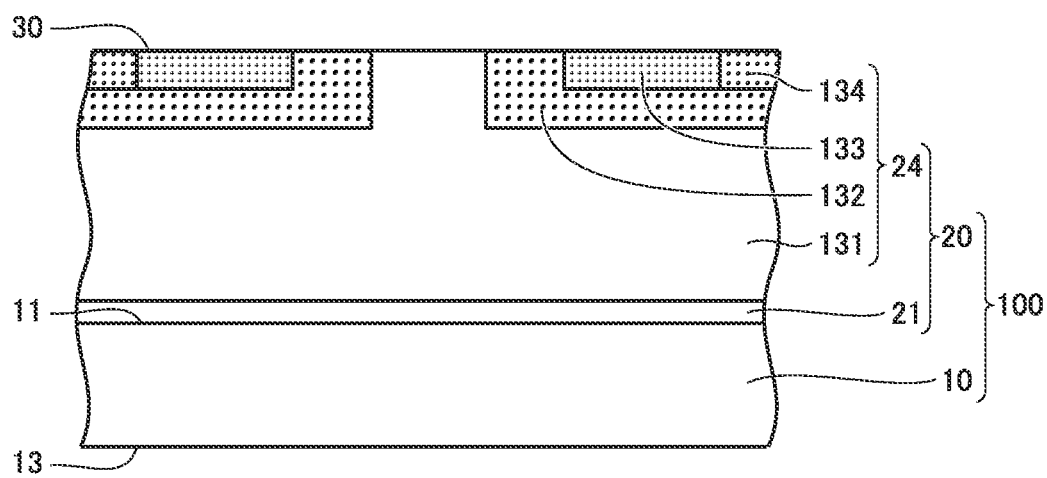
FIG. 10 is a schematic cross-sectional view showing a first step of the method of manufacturing the silicon carbide semiconductor device according to the embodiment.

First, the ion implantation step (S21: FIG. 9) is performed. A p type impurity such as aluminum (Al) is implanted into second main surface 30 on which a mask (not shown) with an opening has been formed. Consequently, a body region 132 having p type conductivity is formed. Then, an n type impurity such as phosphorus (P) is implanted into a prescribed position within body region 132. Consequently, a source region 133 having n type conductivity is formed. Then, a p type impurity such as aluminum is implanted into a prescribed position within source region 133. Consequently, a contact region 134 having p type conductivity is formed (see FIG. 10).

In silicon carbide layer 20, a portion other than body region 132, source region 133 and contact region 134 serves as a drift region 131. Source region 133 is separated from drift region 131 by body region 132. The ion implantation may be performed while silicon carbide epitaxial substrate 100 is heated to about not less than 300° C. and not more than 600° C. After the ion implantation, silicon carbide epitaxial substrate 100 is subjected to activation annealing. The activation annealing activates the impurities implanted into silicon carbide layer 20, to generate a carrier in each region. The activation annealing may be performed in an argon (Ar) atmosphere, for example. The activation annealing may be performed at a temperature of about 1800° C., for example. The activation annealing may be performed for a period of about 30 minutes, for example.

Figure 11:
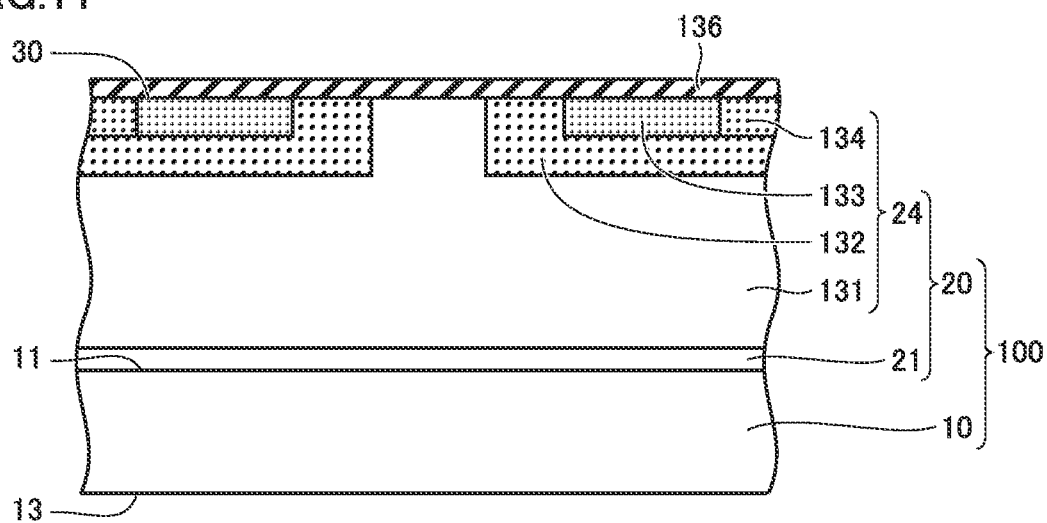
FIG. 11 is a schematic cross-sectional view showing a second step of the method of manufacturing the silicon carbide semiconductor device according to the embodiment.

Next, the oxide film forming step (S22: FIG. 9) is performed. Silicon carbide epitaxial substrate 100 is heated in an atmosphere including oxygen, for example, whereby an oxide film 136 is formed on second main surface 30 (see FIG. 11). Oxide film 136 is made of silicon dioxide ($SiO_2$), for example. Oxide film 136 serves as a gate insulating film. The thermal oxidation process may be performed at a temperature of about 1300° C., for example. The thermal oxidation process may be performed for a period of about 30 minutes, for example.

After oxide film 136 is formed, heat treatment may be further performed in a nitrogen atmosphere. For example, heat treatment may be performed in an atmosphere such as nitrogen monoxide (NO) or nitrous oxide ($N_2O$) at about 1100° C. for about one hour. Subsequently, heat treatment may be further performed in an argon atmosphere. For example, heat treatment may be performed in an argon atmosphere at about 1100 to 1500° C. for about one hour.

Next, the electrode forming step (S23: FIG. 9) is performed. A first electrode 141 is formed on oxide film 136. First electrode 141 serves as a gate electrode. First electrode 141 is formed by CVD, for example. First electrode 141 is made of polysilicon including an impurity and having conductivity, for example. First electrode 141 is formed at a position facing source region 133 and body region 132.

Next, an interlayer insulating film 137 is formed to cover first electrode 141. Interlayer insulating film 137 is formed by CVD, for example. Interlayer insulating film 137 is made of silicon dioxide, for example. Interlayer insulating film 137 is formed in contact with first electrode 141 and oxide film 136. Then, oxide film 136 and interlayer insulating film 137 at a prescribed position are removed by etching. Consequently, source region 133 and contact region 134 are exposed at oxide film 136.

A second electrode 142 is formed at this exposed portion by sputtering, for example. Second electrode 142 serves as a source electrode. Second electrode 142 is made of titanium, aluminum and silicon, for example. After second electrode 142 is formed, second electrode 142 and silicon carbide epitaxial substrate 100 are heated at a temperature of about 900 to 1100° C., for example. Consequently, second electrode 142 and silicon carbide epitaxial substrate 100 are in ohmic contact with each other. Then, a wiring layer 138 is formed in contact with second electrode 142. Wiring layer 138 is made of a material including aluminum, for example.

Next, a third electrode 143 is formed on third main surface 13. Third electrode 143 serves as a drain electrode. Third electrode 143 is made of an alloy containing nickel and silicon, for example (for example, NiSi).

Figure 12:
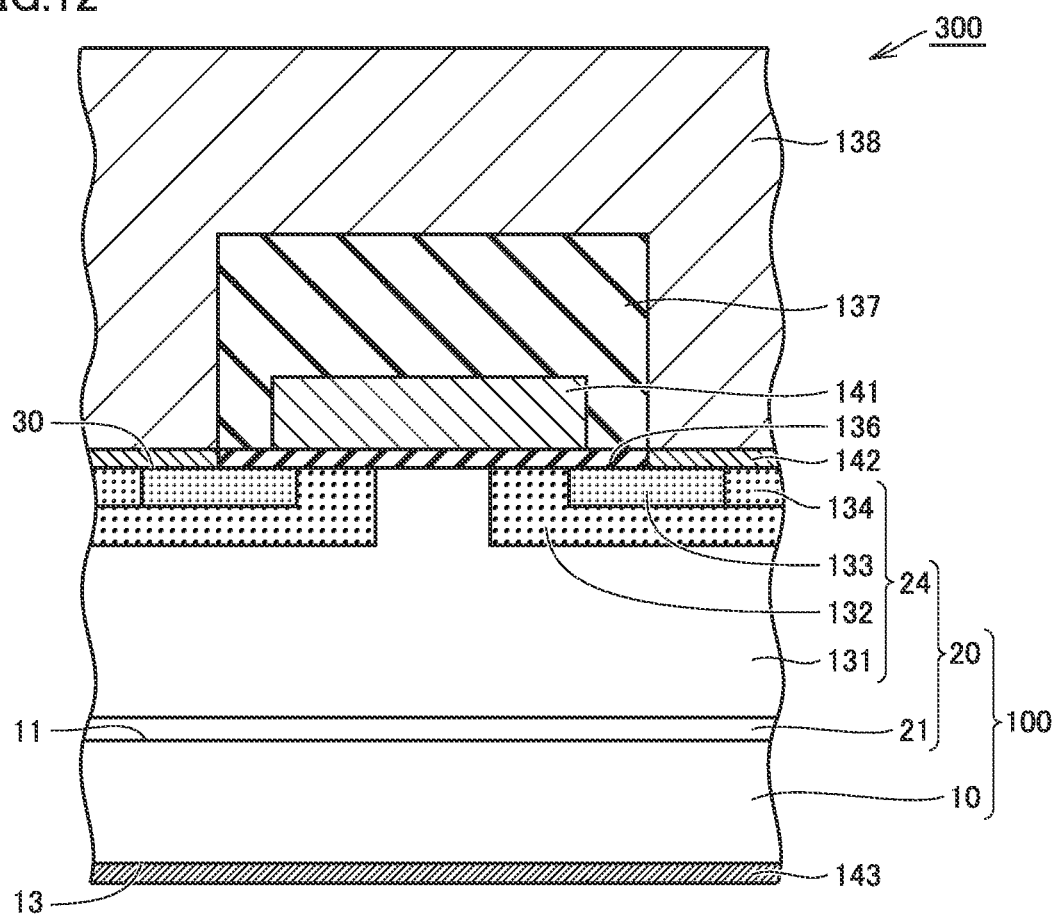
FIG. 12 is a schematic cross-sectional view showing a third step of the method of manufacturing the silicon carbide semiconductor device according to the embodiment.

Next, the dicing step (S24: FIG. 9) is performed. For example, silicon carbide epitaxial substrate 100 is diced along a dicing line, whereby silicon carbide epitaxial substrate 100 is divided into a plurality of semiconductor chips. In this manner, silicon carbide semiconductor device 300 is manufactured (see FIG. 12).

Although the method of manufacturing the silicon carbide semiconductor device according to the present disclosure has been described above with reference to a MOSFET as an example, the manufacturing method according to the present disclosure is not limited as such. The manufacturing method according to the present disclosure can be applied to various types of silicon carbide semiconductor devices such as an IGBT (Insulated Gate Bipolar Transistor), a SBD (Schottky Barrier Diode), a thyristor, a GTO (Gate Turn Off thyristor), and a PiN diode.

It should be understood that the embodiments disclosed herein are illustrative and non-restrictive in every respect. The scope of the present invention is defined by the terms of the claims, rather than the embodiments described above, and is intended to include any modifications within the scope and meaning equivalent to the terms of the claims.

REFERENCE SIGNS LIST 3, 4, 6 line;
5 first flat;
7 arc potion;
10 silicon carbide single-crystal substrate;
11 first main surface;
13 third main surface;
14 fourth main surface (surface);
15 peripheral buffer region;

16 central buffer region;
17 peripheral deep region;
18 central deep region;
19 peripheral superficial region;
20 silicon carbide layer;
21 buffer layer;
22 deep region;
23 superficial region;
24 drift layer;
25 central surface layer;
26 peripheral silicon carbide region;
27 central silicon carbide region (portion);
30 second main surface;
31 outer edge;
32 peripheral region;
33 central region;
34 concentric circle;
35 center;
51 rotational speed meter;
52 control unit;
54 gas supply source;
61, 62 bottom surface;
63 gas jetting port;
64 flow path;
65, 67 side surface;
68 recess;
100 silicon carbide epitaxial substrate;
101 first direction;
102 second direction;
103 circumferential direction;
111 maximum diameter;
131 drift region;
132 body region;
133 source region;
134 contact region;
136 oxide film;
137 interlayer insulating film;
138 wiring layer;
141 first electrode;
142 second electrode;
143 third electrode;
200 manufacturing apparatus;
201 reaction chamber;
211 auxiliary heating mechanism;
203 heating element;
204 quartz tube;
205 heat insulator;
206 induction heating coil;
207 gas inlet port;
208 gas outlet port;
210 susceptor plate;
212 rotation axis;
300 silicon carbide semiconductor device.

The invention claimed is:

1. A silicon carbide epitaxial substrate comprising:
a silicon carbide single-crystal substrate having a first main surface; and
a silicon carbide layer on the first main surface,
the silicon carbide layer having a second main surface opposite to a surface thereof in contact with the silicon carbide single-crystal substrate,
the second main surface having a maximum diameter of not less than 100 mm,
the second main surface having a peripheral region within 5 mm from an outer edge of the second main surface, and a central region surrounded by the peripheral region,
the silicon carbide layer having a central surface layer including the central region,
an average value of a carrier concentration in the central surface layer being not less than $1 \times 10^{14}$ cm$^{-3}$ and not more than $5 \times 10^{16}$ cm$^{-3}$,
circumferential uniformity of the carrier concentration being not more than 2%, and in-plane uniformity of the carrier concentration being not more than 10%,
an average value of a thickness of a portion of the silicon carbide layer sandwiched between the central region and the silicon carbide single-crystal substrate being not less than 5 μm,
circumferential uniformity of the thickness being not more than 1%, and in-plane uniformity of the thickness being not more than 4%,
the circumferential uniformity of the carrier concentration being a ratio of an absolute value of a difference between a maximum value and a minimum value of the carrier concentration in the central surface layer in a circumferential direction, to an average value of the carrier concentration in the central surface layer in the circumferential direction,
the in-plane uniformity of the carrier concentration being a ratio of an absolute value of a difference between a maximum value and a minimum value of the carrier concentration in the central surface layer in the entire central region, to an average value of the carrier concentration in the central surface layer in the entire central region,
the circumferential uniformity of the thickness being a ratio of an absolute value of a difference between a maximum value and a minimum value of the thickness of the portion in the circumferential direction, to an average value of the thickness of the portion in the circumferential direction,
the in-plane uniformity of the thickness being a ratio of an absolute value of a difference between a maximum value and a minimum value of the thickness of the portion in the entire central region, to an average value of the thickness of the portion in the entire central region.

2. The silicon carbide epitaxial substrate according to claim 1, wherein
the maximum diameter is not less than 150 mm.

3. The silicon carbide epitaxial substrate according to claim 1, wherein
the average value of the carrier concentration is not less than $1 \times 10^{15}$ cm$^{-3}$ and not more than $1 \times 10^{16}$ cm$^{-3}$.

4. The silicon carbide epitaxial substrate according to claim 1, wherein
the circumferential uniformity of the carrier concentration is not more than 1%.

5. The silicon carbide epitaxial substrate according to claim 1, wherein
the in-plane uniformity of the carrier concentration is not more than 5%.

6. A method of manufacturing a silicon carbide semiconductor device, comprising the steps of:
preparing the silicon carbide epitaxial substrate according to claim 1; and
processing the silicon carbide epitaxial substrate.

7. The silicon carbide epitaxial substrate according to claim 2, wherein
the average value of the carrier concentration is not less than $1 \times 10^{15}$ cm$^{-3}$ and not more than $1 \times 10^{16}$ cm$^{-3}$.

8. The silicon carbide epitaxial substrate according to claim 2, wherein the circumferential uniformity of the carrier concentration is not more than 1%.

9. The silicon carbide epitaxial substrate according to claim 3, wherein
the circumferential uniformity of the carrier concentration is not more than 1%.

10. The silicon carbide epitaxial substrate according to claim 7, wherein
the circumferential uniformity of the carrier concentration is not more than 1%.

11. The silicon carbide epitaxial substrate according to claim 2, wherein
the in-plane uniformity of the carrier concentration is not more than 5%.

12. The silicon carbide epitaxial substrate according to claim 3, wherein
the in-plane uniformity of the carrier concentration is not more than 5%.

13. The silicon carbide epitaxial substrate according to claim 4, wherein
the in-plane uniformity of the carrier concentration is not more than 5%.

14. The silicon carbide epitaxial substrate according to claim 7, wherein
the in-plane uniformity of the carrier concentration is not more than 5%.

15. The silicon carbide epitaxial substrate according to claim 8, wherein
the in-plane uniformity of the carrier concentration is not more than 5%.

16. The silicon carbide epitaxial substrate according to claim 9, wherein
the in-plane uniformity of the carrier concentration is not more than 5%.

17. The silicon carbide epitaxial substrate according to claim 10, wherein
the in-plane uniformity of the carrier concentration is not more than 5%.

\* \* \* \* \*